United States Patent
Spielberg et al.

(10) Patent No.: US 7,707,380 B2
(45) Date of Patent: Apr. 27, 2010

(54) MEMORIES, METHOD OF STORING DATA IN MEMORY AND METHOD OF DETERMINING MEMORY CELL SECTOR QUALITY

(75) Inventors: Rainer Spielberg, Kirchheim (DE); Detlev Richter, Munich (DE); Andreas Taeuber, Unterschleissheim (DE); Luca de Ambroggi, Munich (DE)

(73) Assignee: Qimonda AG, Munich (DE)

( * ) Notice: Subject to any disclaimer, the term of this patent is extended or adjusted under 35 U.S.C. 154(b) by 608 days.

(21) Appl. No.: 11/541,392

(22) Filed: Sep. 29, 2006

(65) Prior Publication Data

US 2008/0082776 A1    Apr. 3, 2008

(51) Int. Cl.
*G06F 12/00* (2006.01)
*G11C 29/00* (2006.01)

(52) U.S. Cl. ............... 711/170; 365/201; 714/718

(58) Field of Classification Search ............ None
See application file for complete search history.

(56) References Cited

U.S. PATENT DOCUMENTS

| 6,228,684 | B1 * | 5/2001 | Maruyama | 438/113 |
| 6,558,967 | B1 * | 5/2003 | Wong | 438/17 |
| 2003/0007384 | A1 * | 1/2003 | Shimizu | 365/185.03 |
| 2005/0276131 | A1 * | 12/2005 | Kim et al. | 365/201 |
| 2006/0123280 | A1 * | 6/2006 | Tran et al. | 714/718 |

* cited by examiner

*Primary Examiner*—Denise Tran

(57) ABSTRACT

A method of storing data in a memory is provided, including testing a plurality of memory cells of a plurality of memory cell sectors. Each memory cell sector includes a plurality of memory cells. Each memory cell sector is classified into at least one quality class of a plurality of quality classes depending on the results of the testing of the memory cells of the respective memory cell sector. Data is stored in the memory cells of the classified memory cell sectors depending on the quality class of the respective memory cell sector.

17 Claims, 4 Drawing Sheets

FIG 4
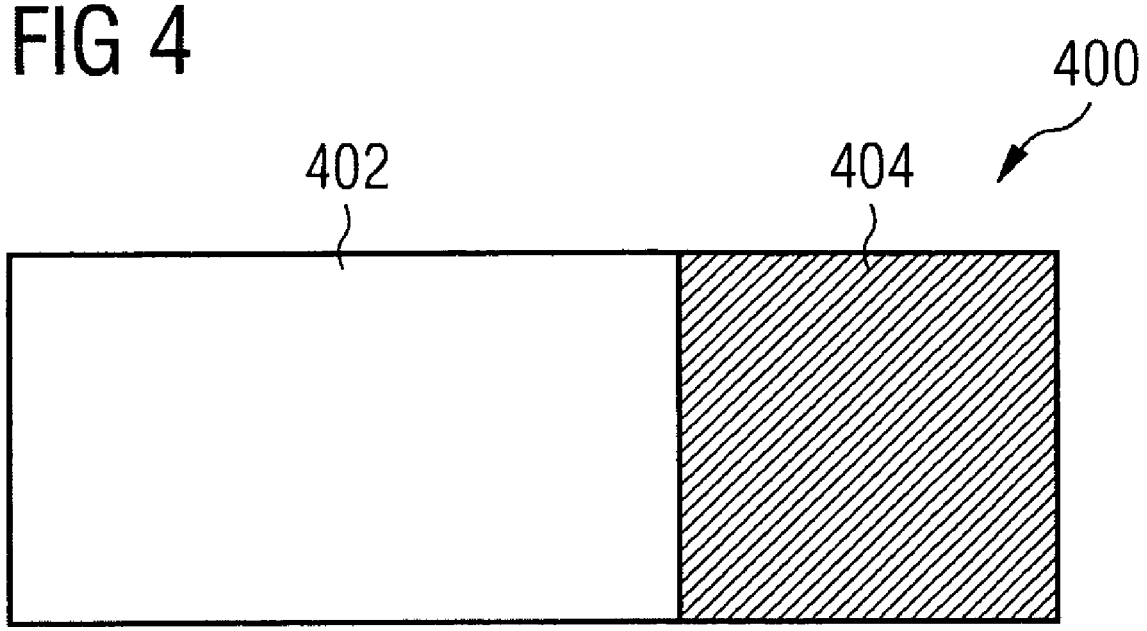
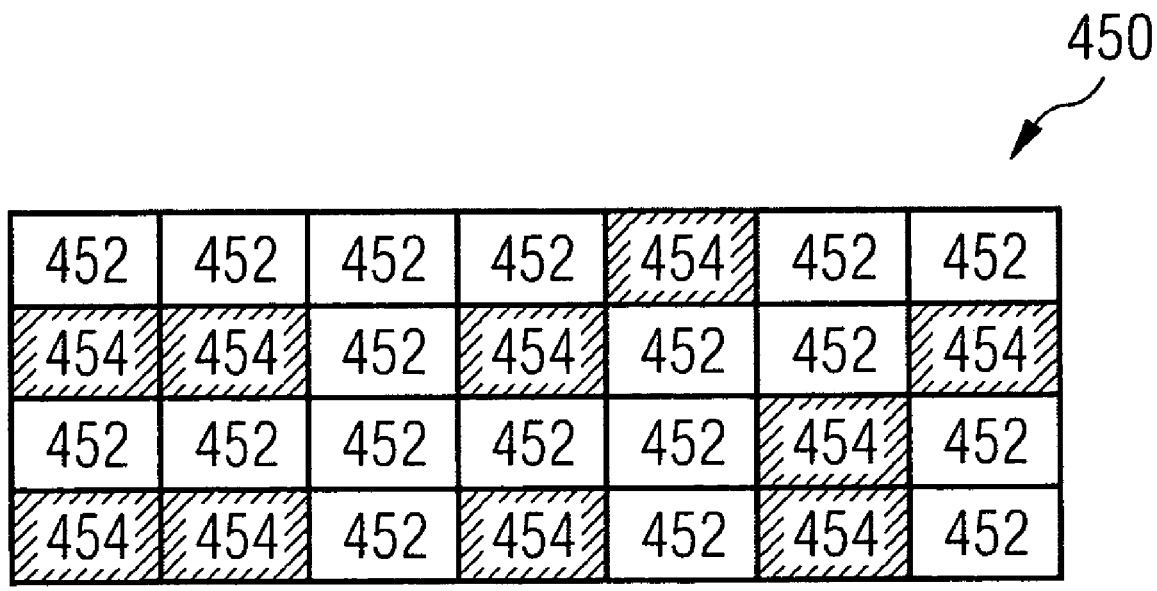

MEMORIES, METHOD OF STORING DATA IN MEMORY AND METHOD OF DETERMINING MEMORY CELL SECTOR QUALITY

TECHNICAL FIELD

The invention relates to memories, a method of storing data in a memory and to a method of determining memory cell sector quality.

BACKGROUND

When partitioning a memory, it is conventional to partition the memory in contiguous sectors such that the logical mapping and the physical mapping are identical. Data is then stored in the sectors of the memory.

SUMMARY OF THE INVENTION

In an embodiment of the invention, a method of storing data in a memory is provided, including testing a plurality of memory cells of a plurality of memory cell sectors, each memory cell sector comprising a plurality of memory cells, classifying each memory cell sector into at least one quality class segment of a plurality of quality class segments of at least one quality class depending on the results of the testing of the memory cells of the respective memory cell sector, and storing data in the memory cells of the classified memory cell sectors depending on the at least one quality class segment of the respective memory cell sector.

These and other features of the invention will be better understood when taken in view of the following drawings and a detailed description.

BRIEF DESCRIPTION OF THE DRAWINGS

For a more complete understanding of the present invention, and the advantages thereof, reference is now made to the following descriptions taken in conjunction with the accompanying drawing, in which:

FIG. 4 is a diagram showing an example of a memory partition.

DETAILED DESCRIPTION OF ILLUSTRATIVE EMBODIMENTS

The invention enables finding the sectors of a memory that are best suited for a particular purpose so that those sectors can be mapped to a partition used for that purpose. This can be accomplished independently from the physical location of the sectors in the memory.

Figure 1:
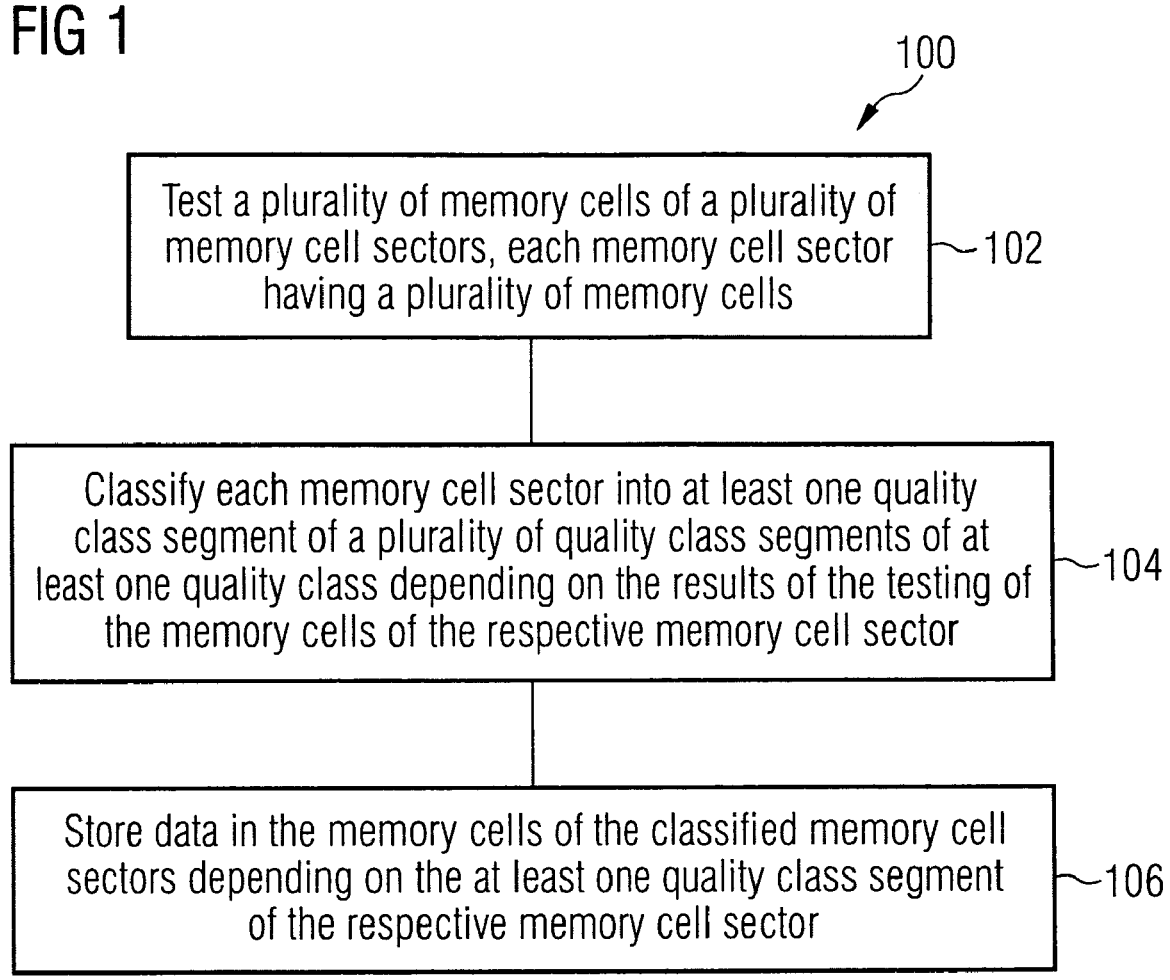
FIG. 1 shows a flow diagram of a method of storing data in a memory in accordance with an exemplary embodiment of the invention.

FIG. 1 shows a flow diagram 100 of a method of storing data in a memory in accordance with an exemplary embodiment of the invention.

At 102, a plurality of memory cells of a plurality of memory cell sectors are tested. Each memory cell sector has a plurality of memory cells that are tested as will be described in more detail below. In an embodiment of the invention, some of the memory cells of the plurality of memory cell sectors are tested. In another embodiment of the invention, all of the memory cells of each memory cell sector are tested.

At 104, each memory cell sector is classified or grouped into at least one quality class segment of a plurality of quality class segments of at least one quality class depending on the results of the testing of the memory cells of the respective memory cell sector. In an embodiment of the invention, the results of the testing process 102 are used for determining one or a plurality of pre-defined quality class segments, for which the test results fulfill the respective pre-defined quality class prerequisites. In other words, at least some of the memory cell sectors or all memory cell sectors are assigned to one or more quality class segments, thereby characterizing the memory cells that are included in the respective memory cell sector, e.g. with respect to their data storage speed capability (e.g. represented by a data storage speed class), e.g. how fast data can be written to or read from the memory cells of the memory cell sector, with respect to the data storage reliability (e.g. represented by a data storage reliability class), e.g. how reliable the data can be stored and distinguished in the memory cells of the memory cell sector, or e.g. with respect to a data storage multilevel capability (e.g. represented by a data storage multilevel capability class), e.g. whether a plurality of bits (e.g. 2, 3, 4, etc.) can be stored in each memory cell of the memory cells of the memory cell sector.

At 106, data is stored in the memory cells of the classified memory cell sectors depending on the at least one quality class segment of the respective memory cell sector.

Figure 2:
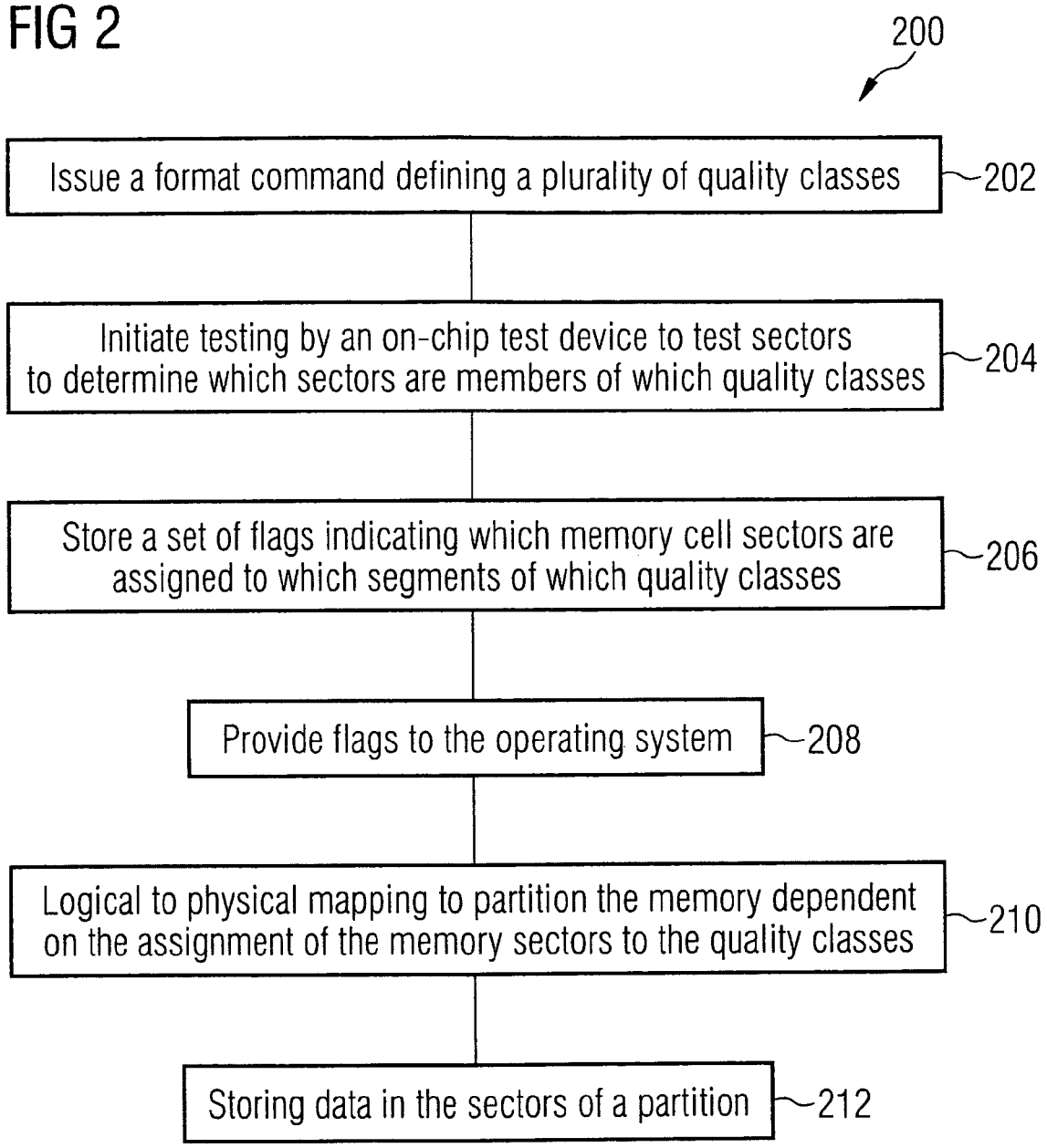
FIG. 2 shows a flow diagram of a method of partitioning a memory in accordance with an exemplary embodiment of the invention.

FIG. 2 shows a flow diagram of a method 200 of storing data in a memory. Processes 202 to 208 of FIG. 2 show a method of determining memory sector quality.

At 202, a plurality of quality classes are defined. The quality classes can be, for example, a reliability class, a speed class, and a density class. Of course different levels of each class (in the following also referred to as quality class segments) can be defined by using different specifications. For example, a highest speed class segment, a medium speed class segment, and an acceptable speed class segment can be defined, and analogously the same is true for the reliability and density classes. In the context used here, the term density class refers to multilevel data storage capability. The desired quality classes can be defined in a format command. In an embodiment of the invention, each quality class may have an arbitrary number of quality class segments, e.g., 2, 3, 4, 5, 6, etc.

In a particular embodiment of the invention, the highest speed class segment could be assigned to a memory cell sector in case that the memory cells of the memory cell sector, according to the testing that will be described in more detail below, can be programmed or read with a speed that is at least as high as a predetermined first speed threshold (e.g. which can be programmed with a predetermined first number of programming pulses at maximum), thereby showing the capability of being used as a cache memory cell, for example. Furthermore, a second speed class segment (e.g. a medium speed class segment) could be assigned to a memory cell sector in case that the memory cells of the memory cell sector, according to the testing that will be described in more detail below, can be programmed or read with a speed that is lower than the first speed threshold but higher than a predetermined second speed threshold (e.g. which can be programmed with at least the predetermined first number of programming pulses and with a predetermined second number of programming pulses at maximum). In this case, the memory cells of the respective memory cell sector may not be fast enough to be used as a cache memory, but may be fast enough to be used as "normal" working memory. Furthermore, a third speed class segment (e.g. an acceptable speed class segment) could be assigned to a memory cell sector in case that the memory cells of the memory cell sector, according to the testing can be programmed or read with a speed that is lower than the second speed threshold but higher than a predetermined third speed threshold (e.g. which can be programmed with at least the predetermined second number of programming pulses and with a predetermined third number of programming pulses at maximum). In this case, the memory cells of the respective memory cell sector may not be fast enough to be used as working memory, but may be fast enough to be used as archive memory. In an alternative embodiment of the invention, more than three, in general, an arbitrary number of speed class segments may be provided in the data storage speed class.

In a particular embodiment of the invention, the highest reliability class segment could be assigned to a memory cell sector in case that the memory cells of the memory cell sector, according to the testing that will be described in more detail below, can be programmed or read with a reliability that is at least as high as a predetermined first reliability threshold, thereby showing the capability of being used as an archive memory cell, for example. Furthermore, a second reliability class segment could be assigned to a memory cell sector in case that the memory cells of the memory cell sector can be programmed or read with a reliability that is lower than the first reliability threshold but higher than a predetermined second reliability threshold, which may be a predetermined minimum reliability threshold representing the minimum reliability the memory cells have to provide. In this case, the memory cells of the respective memory cell sector may not be reliable enough to be used as an archive memory, but may be reliable enough to be used as "normal" working memory. In an alternative embodiment of the invention, more than two, in general, an arbitrary number of reliability class segments may be provided in the data storage reliability class.

In a particular embodiment of the invention, the highest multilevel capability class segment could be assigned to a memory cell sector in case that the memory cells of the memory cell sector have the capability to store four or more bits in each memory cell, thereby showing the capability of being used as a four-bit memory cell, for example. Furthermore, a second multilevel capability class segment could be assigned to a memory cell sector in case that the memory cells of the memory cell sector have the capability to store three bits in each memory cell, thereby showing the capability of being used as a three-bit memory cell, for example. Moreover, a third multilevel capability class segment could be assigned to a memory cell sector in case that the memory cells of the memory cell sector have the capability to store two bits in each memory cell, thereby showing the capability of being used as a two-bit memory cell, for example. Finally, a fourth multilevel capability class segment could be assigned to a memory cell sector in case that the memory cells of the memory cell sector have the capability to store only one bit in each memory cell, thereby showing the capability of being used as a single-bit memory cell only, for example. In an alternative embodiments of the invention, more or less than four, in general, an arbitrary number of multilevel capability class segments may be provided in the data storage multilevel capability class.

At 204, each available memory cell sector of the memory is tested to determine which of the plurality of quality classes includes the available sector as a member. Memory cell sectors that are found to be a member of the data storage reliability class with an acceptably high reliability can be used for archiving purposes, for example. Memory cell sectors that are found to be a member of the data storage speed class with an acceptably high speed can be used for cache, for example. Memory cell sectors that are found to be a member of the data storage multilevel capability class enabling multilevel storage can be used as multilevel cells, for example. Memory cell sectors that are a member of more than one of the data storage quality classes can be used for certain purposes as well. For example, memory cell sectors can be found that are members of a certain data storage speed class and of a certain data storage reliability class. Memory cell sectors that are not in one of the highest data storage reliability quality class segment or in one of the faster data storage speed quality class segments can be used to store user data. The term available memory cell sector means a memory cell sector that is available for storing data. For example, in a FLASH memory, an available memory cell sector would be an ERASE sector, in other words, a plurality of memory cells that are erased together. A test device constructed on the chip with the memory can be used to perform the testing to determine which available memory cell sectors are members of particular quality classes. The test device can perform the testing in response to a format command provided by an operating system.

At 206, a set of flags is stored in the memory. The flags indicate which memory cell sectors are assigned to which quality classes and to which quality class segments. In other words, a binary flag based coding is provided to indicate (encode) the classification for each of the memory cell sectors.

At 208, as a result of the format command that is provided by the operating system, the flags are provided to the operating system so that the operating system knows the number of sectors that are members of each particular quality class segment.

At 210, a handshaking process can now be performed between the memory and the operating system so that the logical to physical mapping can be performed and the memory can be partitioned to meet the desired requirements.

At 212, the type of data that is stored in the memory cell sectors of a partition depend on the quality class or classes that include the sector as a member. As an example of a few data types, the data could be user data, archiving data, or cache data. For example, as explained earlier, memory cell sectors that are found to be a member of the data storage speed class with an acceptably high speed can be used to store cache data. The most reliable memory cell sectors may be used to store archiving data.

FIG. 4 is a diagram showing an example of a memory partition (logical mapping portion) 400 and the corresponding physical sectors (physical mapping portion) 450. In an exemplary embodiment of the invention it is assumed that the format command has specified a 2 Gb (gigabyte) partition 402 (see logical mapping portion) of sectors 452 (see physical mapping portion) with multilevel cells and a 1 Gb partition 404 (see logical mapping portion) of fast sectors 454 (see physical mapping portion). Sectors 454 that have been flagged as fast are indicated with cross-hatching. The logical to physical mapping enables the sectors 454 flagged as fast to be used in multilevel cell partition 404 and the sectors 452 flagged as having multi-cell capability to be used in fast partition 402.

Figure 3:
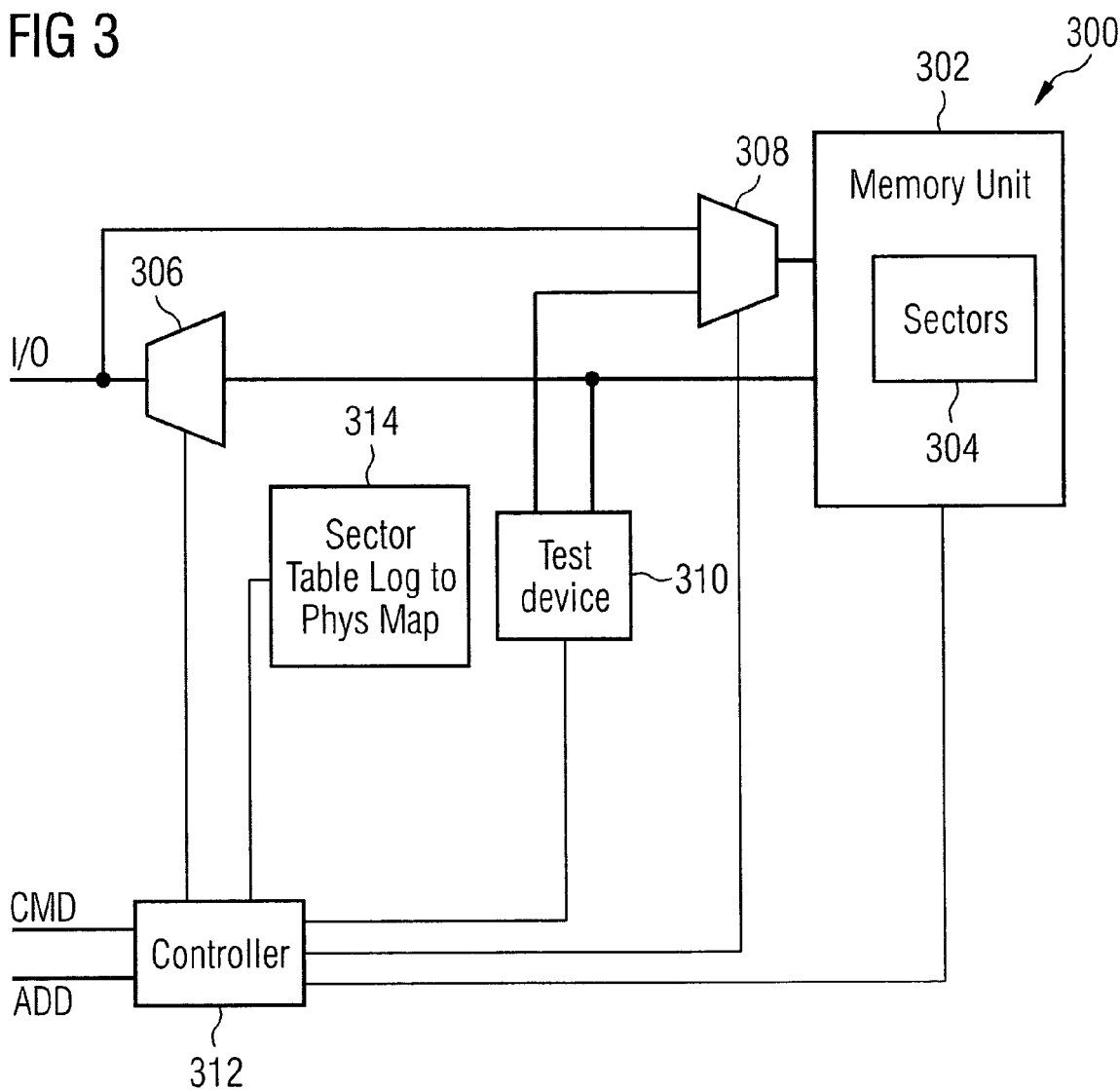
FIG. 3 is a schematic diagram of a memory.

FIG. 3 is a schematic diagram of a memory 300 constructed to perform the method as described above in accordance with an exemplary embodiment of the invention.

The memory 300 includes memory means, for example, the memory unit 302. The memory unit 302 includes one or a plurality of memory cell fields, each memory field having a plurality of sectors 304, decoding circuitry, sensing circuitry, programming circuitry, erase circuitry, and other circuitry necessary for a functioning memory unit 302 (those components are not shown in FIG. 3). To illustrate just a few examples, the sectors 304 of the memory cell field can include nonvolatile memory cells in the form of FLASH memory cells, e.g. programmable metallization cells (PMC), also referred to as conductive bridging random access memory cells (CBRAM), phase change memory cells (PCM), magnetoresistive random access memory cells (MRAM), organic random access memory cells (ORAM), etc. Multiplexers 306 and 308 are operated to provide the desired data flow. A test device 310 is provided to perform the built-in self-test functions for classifying the sectors 304 of the memory cell field of the memory unit 302. The test device 310 tests the plurality of sectors 304 to determine which sector 304 is a member of which particular ones of a plurality of quality classes and which particular ones of a plurality of quality class segments of a respective quality class. For example one of the sectors 304 may be a member of a certain reliability class segment and of a first speed class segment. Another one of the sectors 304 may be a member of the mentioned reliability class segment and a member of a second speed class segment. The possibility for defining different classes should be apparent. As mentioned during the discussion of the method, the test device 310 can perform the testing in response to a format command being provided by an operating system being executed for example of a computer, the memory 300 is connected to. A controller 312 is connected to command lines CMD and address lines ADD to insure proper cooperation between the components of the memory 300 and to coordinate communication with external components via the I/O bus (I/O), e.g. with the computer. The computer may be a personal computer, a notebook computer, a personal digital assistant device, a camera, etc. In general, the computer may be any kind of computing device that is connected to the memory 300 for storing data and/or computer program code therein. A sector table 314 is used to store the logical to physical mapping of the sectors 304 as was discussed when explaining the method steps. The sector table 314 could be stored in the memory unit 302 or in another storage device such as in a plurality of registers (not shown).

The particular on-chip test functions that are carried out will depend on the type of cells used to construct the memory and the invention should not be construed as being limited to any particular type of testing. Consider the case of a FLASH memory, for example. Here the reliability of the sectors 304 can be tested by measuring two or three points of the conductance curve I/V for the cells in each available sector 304. The speed of the sectors 304 could be tested by checking the number of pulses for a given distribution width or by checking the shift in the threshold voltage of each cell after a predetermined number of pulses.

Multilevel cell (MLC) functionality could be tested by executing e.g. six levels of programming to allow e.g. four levels. By way of example, in case that the test function can simply program successfully three levels, then two levels are released for the customer. In another example, in case that the test function can simply program successfully four levels, then three levels are released for the customer, and so on. If the memory cell sector has enough margin during the on-chip test function, in one embodiment of the invention, the memory cell sector is released with one level less than successfully tested. In an alternative embodiment of the invention, the memory cell sector is released with two levels (alternatively three or more) less than successfully tested.

Merely for illustrative purposes, a more specific example of on-chip test functions will be given for the case of a FLASH memory:

An available sector 304 (in this case a sector 304 that has been erased), will be programmed with a fixed number of pulses, for example, two pulses. An automatic slope measurement function is executed for each memory cell. Cells are found that have a conductance that is higher than a defined first threshold (e.g. 13 µA/V) and cells are found that have a conductance that is lower than a defined second threshold (e.g. 9 µA/V).

The available sector 304 is erased; the maximum erase voltage to pass the EV (erased voltage) level is stored.

The erased sector 304 is now programmed to a fixed PV (programmed voltage) level. The number of PGM (programming) pulses is stored. An automatic slope measurement function is executed per cell. Cells are found that have a conductance that is higher than a defined third threshold (e.g. 12.5 µA/V) and cells are found that have a conductance that is lower than a defined fourth threshold (e.g. 8.5 µA/V).

All of the above results are compared with reference data. The number of PGM pulses, the maximum erase voltage and the first conductance results can be used to define the speed class segment. The conductance results in combination with the maximum erase voltage can define the reliability class segment. All sectors 304 that are fast enough (higher than a predefined threshold) and all sectors 304 that are reliable enough (higher than a predefined threshold) can be used for the six level MLC programming test. With a predefined limited number of pulses, a certain number of critical MLC patterns are programmed. All sectors 304 that could be read with a predefined single bit failure rate are classified as MLC ready sectors. The read command is a special margin read command.

In an embodiment of the invention, each one of the plurality of quality classes is selected from a group of quality classes consisting of a data storage speed class, a data storage reliability class, and a data storage multilevel capability class.

Furthermore, a test device may be used which is integrated with the memory to perform the testing.

Furthermore, it may be indicated to an operating system, which of the memory cell sectors are classified into a first one of the plurality of quality classes and it may be indicated to an operating system, which of the memory cell sectors are classified into a second one of the plurality of quality classes.

In an embodiment of the invention, a set of flags is stored in the memory indicating the quality class or quality classes the memory cell sectors are classified into.

The testing may be initiated with a format command that is provided by the operating system.

In another embodiment of the invention, the plurality of quality classes are defined with a format command that is provided by the operating system.

As a result of a format command, the classification results of the memory cell sectors may be indicated to an operating system.

Furthermore, the memory may be partitioned depending on the quality classes of the memory cell sectors, wherein the partitioning may be carried out by the operating system.

In an embodiment of the invention, a method of determining memory cell sector quality is provided, comprising defining a plurality of quality classes each quality class selected from a group of quality classes consisting of a data storage speed class, a data storage reliability class, and a data storage multilevel capability class, testing at least some memory cell sectors of a memory, and classifying the memory cell sectors dependent on the test result into at least one of the quality classes.

A test device may be used that is integrated with the memory to perform the testing.

Furthermore, it may be indicated to an operating system, which of the memory cell sectors are classified into a first one of the plurality of quality classes and it may be indicated to an operating system, which of the memory cell sectors are classified into a second one of the plurality of quality classes.

In another embodiment of the invention, a set of flags is stored in the memory, the set of flags indicating the quality class or quality classes the memory cell sectors are classified into.

In an embodiment of the invention, the testing is initiated with a format command that is provided by the operating system.

Furthermore, the plurality of quality classes may be defined with a format command that is provided by the operating system.

Moreover, as a result of a format command, the classification results of the memory cell sectors may be indicated to an operating system.

In an embodiment of the invention, the memory is partitioned depending on the quality classes of the memory cell sectors.

In another embodiment of the invention, a memory is provided, comprising a memory unit including a plurality of memory cell sectors, each memory cell sector comprising a plurality of memory cells, a test device testing the plurality of memory cell sectors to determine which of the plurality of memory cell sectors are members of particular ones of a plurality of quality classes, and a memory controller coupled to the memory unit and to the test device, the memory controller storing data in the memory cells of the classified memory cell sectors depending on the quality class of the respective memory cell sector.

Furthermore, each one of the plurality of quality classes may be selected from a group of quality classes consisting of a data storage speed class, a data storage reliability class, and a data storage multilevel capability class.

The memory controller may further indicate to an operating system, which of the memory cell sectors are classified into a first one of the plurality of quality classes; and which of the memory cell sectors are classified into a second one of the plurality of quality classes.

A flag memory unit may further be provided storing a set of flags indicating the quality class or quality classes the memory cell sectors are classified into.

In one embodiment of the invention, the test device performs the testing in response to a format command provided by an operating system.

Furthermore, the plurality of quality classes may be defined by a format command that is provided by the operating system.

In another embodiment of the invention, a memory is provided, comprising a memory unit including a plurality of memory cell sectors and a test device testing the plurality of memory cell sectors to determine which of the plurality of memory cell sectors are members of particular ones of a plurality of quality classes, at least some of the plurality of quality classes selected from a group consisting of a data storage speed class, a data storage reliability class, and a data storage multilevel capability class.

Furthermore, a memory controller may be provided indicating to an operating system, which of the memory cell sectors are classified into a first one of the plurality of quality classes; and which of the memory cell sectors are classified into a second one of the plurality of quality classes.

The test device may perform the testing in response to a format command provided by an operating system.

The plurality of quality classes may be defined by a format command provided by an operating system.

In another embodiment of the invention, a memory is provided, comprising memory means including a plurality of sectors, test means testing the plurality of sectors to determine which of the plurality of memory cell sectors are members of particular ones of a plurality of quality classes, and memory control means coupled to the memory means and to the test means, the memory control means storing data in the memory cells of the classified memory cell sectors depending on the quality class of the respective memory cell sector.

It should be appreciated by those skilled in the art, that the described processes may be implemented in hardware, software, firmware or a combination of these implementations as appropriate. For example, the operation of selecting a memory cell may be carried out by word and bit-line decoders under the control of an I/O interface unit such as a computer. Accordingly, the described operations may be implemented as executable instructions stored on a computer readable medium (removable disk, volatile or non-volatile memory, embedded processors, etc.), the stored instruction code operable to program a computer of other such programmable device to carry out the intended functions.

The foregoing description has been presented for purposes of illustration and description. It is not intended to be exhaustive or to limit the invention to the precise form disclosed, and obviously many modifications and variations are possible in light of the disclosed teaching. The described embodiments were chosen in order to best explain the principles of the invention and its practical application to thereby enable others skilled in the art to best utilize the invention in various embodiments and with various modifications as are suited to the particular use contemplated. It is intended that the scope of the invention be defined solely by the claims appended hereto.

What is claimed is:

1. A method of storing data in a memory, comprising
testing a plurality of memory cells of a plurality of memory cell sectors, each memory cell sector comprising a plurality of memory cells;
classifying each memory cell sector into at least one quality class segment of a plurality of quality class segments of at least one quality class of a plurality of quality classes depending on the results of the testing of the memory cells of the respective memory cell sector; and
storing data in the memory cells of the classified memory cell sectors depending on the at least one quality class segment of the respective memory cell sector;
indicating to an operating system, which of the memory cell sectors are classified into a first one of the plurality of quality classes; and
indicating to an operating system, which of the memory cell sectors are classified into a second one of the plurality of quality classes.

2. The method according to claim 1, wherein each one of the plurality of quality classes selected from a group of quality classes consisting of a data storage speed class, a data storage reliability class, and a data storage multilevel capability class.

3. The method according to claim 1, further comprising using a test device integrated with the memory to perform the testing.

4. The method according to claim 1, further comprising storing a set of flags in the memory indicating the quality class or quality classes the memory cell sectors are classified into.

5. The method according to claim 1, further comprising initiating the testing with a format command that is provided by an operating system.

6. The method according to claim 1, further comprising defining the plurality of quality classes with a format command that is provided by an operating system.

7. The method according to claim 1, further comprising, as a result of a format command, indicating to an operating system the classification results of the memory cell sectors.

8. The method according to claim 1, further comprising partitioning the memory depending on the quality classes of the memory cell sectors.

9. The method according to claim 8, wherein the partitioning is carried out by an operating system.

10. A memory, comprising
a memory unit including a plurality of memory cell sectors, each memory cell sector comprising a plurality of memory cells;
a test device configured to test the plurality of memory cell sectors to determine which of the plurality of memory cell sectors are members of particular ones of a plurality of quality classes; and
a memory controller coupled to the memory unit and to the test device, the memory controller storing data in the memory cells of the classified memory cell sectors depending on the quality class of the respective memory cell sectors;
wherein the memory controller is configured to indicate to an operating system, which of the memory cell sectors are classified into a first one of the plurality of quality classes;
and which of the memory cell sectors are classified into a second one of the plurality of quality classes.

11. The memory according to claim 10, wherein each one of the plurality of quality classes comprises a class selected from the group consisting of a data storage speed class, a data storage reliability class, and a data storage multilevel capability class.

12. The memory according to claim 11, wherein the test device is configured to perform the testing in response to a format command provided by an operating system.

13. The memory according to claim 10, further comprising a flag memory unit configured to store a set of flags indicating the quality class or quality classes the respective memory cell sectors are classified into.

14. The memory according to claim 10, wherein the plurality of quality classes are defined by a format command that is provided by an operating system.

15. A memory, comprising:
a memory unit including a plurality of memory cell sectors; and
a test device capable of testing the plurality of memory cell sectors to determine which of the plurality of memory cell sectors are members of particular ones of a plurality of quality classes;
at least some of the plurality of quality classes selected from a group consisting of a data storage speed class, a data storage reliability class, and a data storage multi-level capability class;
wherein the test device is capable of performing the testing in response to a format command provided by an operating system.

16. The memory according to claim 15, further comprising:
a memory controller capable of indicating to an operating system, which of the memory cell sectors are classified into a first one of the plurality of quality classes; and which of the memory cell sectors are classified into a second one of the plurality of quality classes.

17. The memory according to claim 15, wherein the plurality of quality classes are defined by a format command provided by an operating system.

* * * * *